United States Patent
Vere et al.

(10) Patent No.: US 8,869,380 B2
(45) Date of Patent: Oct. 28, 2014

(54) MICROCIRCUIT CARD COMPRISING A LIGHT-EMITTING DIODE

(75) Inventors: Denis Vere, Argentre du Plessis (FR); Loïc Le Garrec, Chateaubourg (FR)

(73) Assignee: Oberthur Technologies, Levallois-Perret (FR)

( * ) Notice: Subject to any disclaimer, the term of this patent is extended or adjusted under 35 U.S.C. 154(b) by 575 days.

(21) Appl. No.: 12/854,803

(22) Filed: Aug. 11, 2010

(65) Prior Publication Data

US 2011/0037607 A1 Feb. 17, 2011

(30) Foreign Application Priority Data

Aug. 11, 2009 (FR) ...................... 09 55624

(51) Int. Cl.
- *B23P 17/04* (2006.01)
- *G06K 19/07* (2006.01)
- *G06K 19/067* (2006.01)

(52) U.S. Cl.
CPC .......... *G06K 19/0723* (2013.01); *G06K 19/067* (2013.01)
USPC ............ 29/600; 340/10.4; 340/5.86; 340/5.1; 235/492; 235/488; 455/41.1; 455/41.2; 29/592; 29/825; 345/204; 345/205; 345/214

(58) Field of Classification Search
USPC ............ 340/572.1, 5.4, 5.32, 5.6–5.62, 5.81, 340/7.58, 7.61, 10.1, 10.52, 13.26, 815.45, 340/815.55; 235/492, 493, 488; 455/90.1, 455/418, 575.1, 574, 41.1, 41.2; 29/592.1, 29/592, 825
See application file for complete search history.

(56) References Cited

U.S. PATENT DOCUMENTS

| | | | | |
|---|---|---|---|---|
| 4,918,631 A * | 4/1990 | Hara et al. | .................... | 361/737 |
| 5,111,033 A * | 5/1992 | Fujita et al. | .................. | 235/488 |
| 5,276,311 A * | 1/1994 | Hennige | ....................... | 235/380 |
| 5,955,961 A * | 9/1999 | Wallerstein | .................... | 340/5.4 |
| 6,454,172 B1 * | 9/2002 | Maeda et al. | ..................... | 235/492 |
| 6,635,363 B1 * | 10/2003 | Duclos et al. | ................ | 428/690 |
| 6,642,652 B2 * | 11/2003 | Collins et al. | ................ | 313/512 |
| 6,650,044 B1 * | 11/2003 | Lowery | ........................ | 313/502 |
| 6,786,407 B1 * | 9/2004 | Takasugi | ....................... | 235/451 |
| 6,863,220 B2 * | 3/2005 | Selker | ............................ | 235/492 |
| 6,963,166 B2 * | 11/2005 | Yano et al. | .................... | 313/498 |
| 7,543,156 B2 * | 6/2009 | Campisi | ....................... | 713/186 |
| RE41,171 E * | 3/2010 | Howe, Jr. | ................ | 340/539.13 |
| 7,762,469 B2 * | 7/2010 | Sueoka et al. | ................ | 235/492 |

(Continued)

FOREIGN PATENT DOCUMENTS

| | | | | |
|---|---|---|---|---|
| EP | 1753037 A1 * | 2/2007 | ............. | H01L 33/50 |
| EP | 1 988 583 | 11/2008 | | |
| JP | 2005293181 A * | 10/2005 | ............. | G06K 19/00 |

*Primary Examiner* — Daniel Wu
*Assistant Examiner* — Son M Tang
(74) *Attorney, Agent, or Firm* — Cozen O'Connor

(57) ABSTRACT

The light-emitting diode is provided with a lid and is capable of emitting a first predefined color. The card further comprises a near field communications antenna circuit, the circuit and the diode being configured so that the diode emits light when a current of predefined intensity flows in the circuit. More particularly, the lid of the diode is coated with a mass of material forming means for selecting a set of wavelengths from those making up the first color so that the light transmitted through the mass has a second predefined color different from the first color.

14 Claims, 1 Drawing Sheet

(56) References Cited

U.S. PATENT DOCUMENTS

| | | | |
|---|---|---|---|
| 7,950,585 B2* | 5/2011 | Skowronek et al. | 235/492 |
| 8,164,439 B2* | 4/2012 | Dempsey et al. | 340/539.12 |
| 8,212,653 B1* | 7/2012 | Goldstein et al. | 340/10.1 |
| 8,269,410 B2* | 9/2012 | Kijima et al. | 313/501 |
| 8,467,192 B2* | 6/2013 | Stromberg | 361/749 |
| 2006/0244592 A1* | 11/2006 | Kansala et al. | 340/571 |
| 2008/0074032 A1* | 3/2008 | Yano et al. | 313/503 |
| 2008/0265039 A1* | 10/2008 | Skowronek et al. | 235/492 |
| 2008/0303735 A1* | 12/2008 | Fujimoto et al. | 343/787 |
| 2009/0026915 A1* | 1/2009 | Nagatomi et al. | 313/503 |
| 2009/0167495 A1 | 7/2009 | Smith et al. | |
| 2010/0273469 A1* | 10/2010 | Seban et al. | 455/418 |
| 2012/0187824 A1* | 7/2012 | Yamakawa et al. | 313/503 |

* cited by examiner

MICROCIRCUIT CARD COMPRISING A LIGHT-EMITTING DIODE

RELATED APPLICATIONS

This application claims the priority of French application Ser. No. 09/55624 filed Aug. 11, 2009, the entire content of which is hereby incorporated by reference.

FIELD OF THE INVENTION

The present invention relates to the technical field of microcircuit cards, more currently designated as "chip cards".

It more particularly but not specifically applies to the field of chip cards comprising a magnetic antenna for near field communications, for example formed by a winding of a plurality of electrically conductive turns, incorporated into the card, allowing so-called "contactless" communications to be established with a contactless card reader device.

BACKGROUND OF THE INVENTION

Such cards may be of the "contactless" type, since they only include a "contactless" interface or of the "dual interface" type since they include two interfaces: a first "contactless" interface and a second interface using external electric contacts for establishing a so-called "contact" communications.

In both of these types of chip cards, the body of the card generally includes an antenna circuit comprising the near field communications antenna and a microcircuit electrically connected to both ends of the antenna. The microcircuit thus forms a communications module, also designated by NFC (Near Field Communication) module.

A user of such a card may access various wireless services, such as for example secured electronic payment services, door-opening services or may exchange information with a device for contactless reading of the card adapted to NFC technology.

In order to use this type of services or for exchanging information, the user brings his/her mobile terminal closer to such a reading device, such as for example a payment terminal or an access terminal, so that near field communications may be established.

It is known from the state of the art how to equip such cards with an indicator light capable of being lit when near field communication is established. This notably allows the user of the card to be informed on proper progress of the communication or, on the contrary, on its failure.

The indicator light for example comprises a light-emitting diode capable of emitting light when a current of predefined intensity flows through it. The diode is then connected to the antenna circuit in such a way that, when the card is placed in proximity to the card reader, a current flows in the antenna circuit causing light emission from the diode.

The diode usually comprises a semiconducting junction capable of emitting light with a predefined color when it is activated and a lid, i.e. a transparent external casing for protecting this junction.

The predefined emission color of the diode notably depends on its semiconducting junction. It is thereby possible to obtain different colors of indicator lights by changing the nature of the semiconducting junction of the diode.

For aesthetic reasons, it may then be of interest to select the color of the diode depending on a display of the card. For example, selecting a diode of yellow color for representing a sun, a diode of red color for representing an alarm indicator light, etc.

Now, the configuration of the antenna circuit and of the diode should be selected so as to define together a resonance frequency substantially corresponding to a predefined near field communication frequency such as for example the one defined by the ISO 14443 standard, substantially equal to 13.56 MHz.

This resonance frequency notably depends on the sizes and on the shape of the antenna as well as on the capacitance of the semiconducting junction of the diode.

As a result, in order to produce two distinct cards with indicator lights with distinct colors, two diodes have to be available, having distinct semiconducting junctions and therefore distinct electric capacitances.

Thus, in order to obtain a resonance frequency substantially equal to the predefined near field communication frequency, the shape and the dimensions of the antenna circuit are adjusted by taking into account the electric characteristics of the diode, and notably those of the semiconducting junction.

The drawback is that this causes additional production costs and developments. Indeed, for each card display requiring a new color of indicator light, the antenna circuit has to be considerably modified and many adjustments or changes in the production equipment have to be carried out, which may prove to be relatively long and costly.

SUMMARY OF THE INVENTION

One object of the invention is to produce cards with indicator lights of different colors in a simple and inexpensive way.

This and other objects are attained in accordance with one aspect of the invention directed to a microcircuit card comprising at least one light-emitting diode provided with a lid, capable of emitting a first predefined color and a near field communications antenna circuit, the circuit and the diode being configured so that the diode emits light when a current of predefined intensity flows in the circuit. The lid of the diode is coated with a mass of material forming means for selecting a set of wavelengths among those making up the first color so that the light transmitted by the mass has a second predefined color different from the first color.

In an embodiment of the invention, the lid, i.e. the external casing of the diode, is covered with a mass of material which forms means for selecting wavelengths. Thus, when the light emitted by the diode is transmitted through the mass of material, this mass plays the role of a filter which suppresses the undesirable wavelengths in order to only let through the wavelengths making up the light of the second predefined color.

Further, this mass of material has the advantage of forming a mechanical protection of the diode against external aggressions and for example against torsional and flexural forces and also compressional forces to which it is subject during the manufacturing of the card, notably during lamination operations.

Because it is possible to obtain several colors of the light of the indicator light without changing the diode, the configuration of the antenna circuit and of the diode is unchanged from one card to the other regardless of the selected color for the indicator light.

With this, savings on the production costs and considerable simplification of the manufacturing of the cards with indicator lights of different colors may notably be obtained.

It is desirable to select a diode emitting a light composed of a large number of wavelengths in order to be able to obtain a large number of distinct colors by filtering.

Thus, preferably, the light emits white light consisting of wavelengths extending over the whole of the visible spectrum.

A card according to an embodiment of the invention may further include one or more of the features according to which:

- the first predefined color is substantially white;
- the diode comprises a semiconducting junction emitting wavelengths in a primary spectral region and means for converting wavelengths from the primary region to a second spectral region corresponding to the first predefined color;
- the primary spectral region extends from about 370 nm to 420 nm or from 420 nm to 480 nm and the second spectral region substantially extends over the whole of the visible spectrum;
- the material of the mass essentially comprises a colored product with a color substantially corresponding to the second predefined color;
- the material of the mass essentially comprises a resin which is polymerizable with an ultraviolet light and/or a thermosetting resin;
- the configuration of the antenna circuit and of the diode is defined by configuration parameters selected from a length of a wire of an antenna of the circuit, a gap between two turns of the antenna, a width of the wire of the antenna, a number of turns of the antenna, a capacitance of a semiconducting junction of the diode;
- the antenna circuit comprises a microcircuit and an antenna connected to the microcircuit;
- the diode is of the SMC (surface mounted component) type;
- the card comprises a card body incorporating the antenna circuit and the diode, laid out so as to let through the light which may be emitted by the diode.

Another aspect of the invention is directed to a method for manufacturing a card according to any of the preceding claims, the card comprising a body obtained by lamination of a plurality of layers, at least one of which bears the antenna circuit and the diode, characterized in that, before lamination of the layers together, a material is deposited as a mass on the lid of the diode.

DETAILED DESCRIPTION OF THE DRAWINGS

Figure 1:
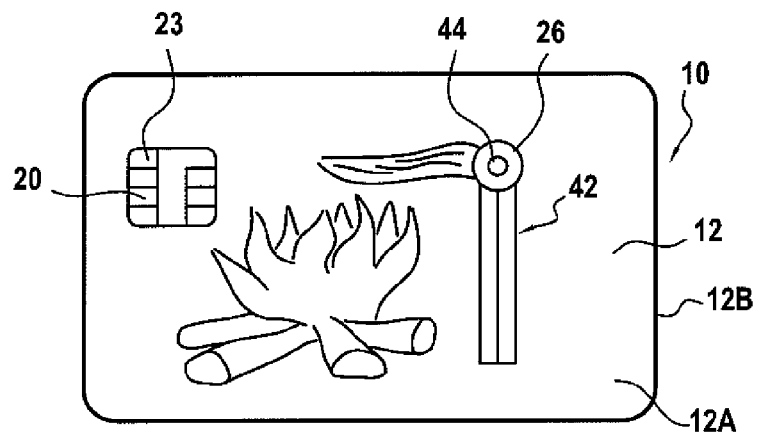
FIG. 1 illustrates a top view of a microcircuit card according to an embodiment of the invention comprising a light-emitting diode.

A microcircuit card according to a first embodiment is illustrated in FIG. 1. This card is designated by the general reference 10.

This card 10 comprises a card body 12 delimited by first 12A and second 12B opposite faces. The card body 12 delimits outer dimensions of the card 10. The outer dimensions for example being defined by the ID-1 format of the ISO 7816 standard.

This card body 12 is for example made in plastic material essentially comprising polyvinyl chloride. Optionally, the card body 12 may be made in any other suitable material.

In the described example and preferably, the card body 12 is formed by lamination of a superposition of layers 13 so as to form a semi-rigid or even rigid card support.

In the embodiment of the invention, the card 10 is a so-called dual card. For this purpose, the card 10 comprises a near field communications antenna circuit 18. Preferably, the circuit 18 comprises a microcircuit 14 (illustrated in dotted lines in FIG. 2) and a near field communications antenna 16, connected to the microcircuit 14 allowing contactless communication with an external card reader (not shown).

Optionally, in an alternative not illustrated in the figures, the card 10 may be a card of the "contactless" type. In this case, the card 10 does not comprise any external interface allowing communication with contact and the antenna circuit 18 is completely integrated into the body 12 of the card 10.

Further, the microcircuit 14 is electrically connected to an external interface 20 of contacts in order to also allow establishment of a communication with contact with an external card reader (not shown). Conventionally, this external interface 20 comprises eight lands 23 of electric contact defined by the ISO 7816 standard of chip cards.

Figure 2:
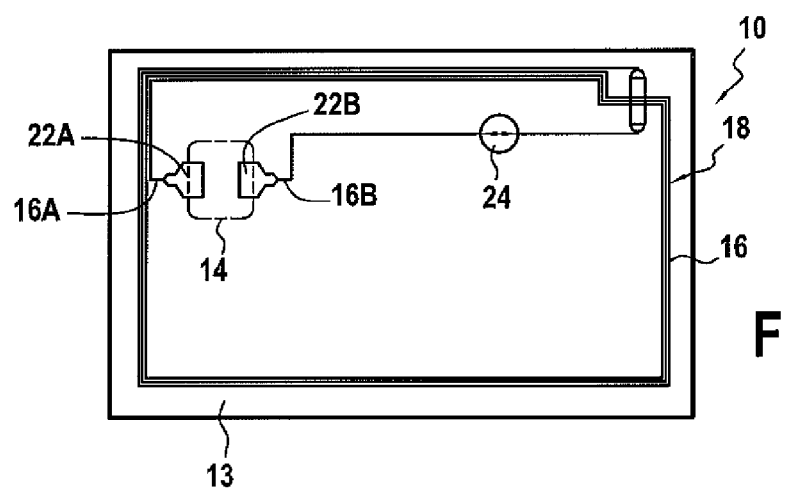
FIG. 2 illustrates a top view in transparence of the card of FIG. 1 notably showing an antenna circuit and the light-emitting diode.

As this is illustrated in FIG. 2, the antenna 16 is for example formed by a plurality of electrically conducting turns with a generally rectangular shape running at least partly along the periphery of the card body 12. In a non-illustrated alternative, the antenna 16 may only extend over half of the card body 12.

Further in this example, the antenna 16 comprises two end portions 16A and 16B intended to be electrically connected to the microcircuit 14.

In the example described, both ends 16A, 16B are electrically connected to the microcircuit 14 via connection lands of the microcircuit 14 provided for this purpose or, as this is illustrated in FIG. 2, via contact pads 22A, 22B of suitable shape.

The pads 22A, 22B are for example electrically connected to the ends 16A, 16B of the antenna 16 by a standard brazing or soldering method.

As this is illustrated in FIG. 2, the antenna circuit 18 is incorporated into the card body 12. The antenna 16 is preferably formed by inlaying an electrically conducting wire on one of the layers 13 of the body 12 before its lamination for example by means of an ultrasonic method.

Further, in the described example, a cavity for receiving the microcircuit 14 is machined in the body 12 substantially at right angles to the pads 22A, 22B in order to expose them at least partly so that contact lands are exposed for the electric connection of the microcircuit 14 and of the antenna 16.

More particularly, the card 10 comprises at least one light-emitting diode 24, provided with a lid 30, capable of emitting a first predefined color. The light-emitting diode 24 thus forms an indicator light 26 capable of indicating proper establishment of a near field communication with an external card reader. This diode 24 is illustrated in detail in FIG. 3.

More specifically, the antenna circuit 16 and the diode 24 are configured so that the diode 24 emits light when a current of predefined intensity flows in the circuit 18, i.e. when the near field communication is established with a contactless external card reader.

In a way known per se, a diode 24 is an electronic component capable of emitting light when an electric current flows through it.

Figure 3:
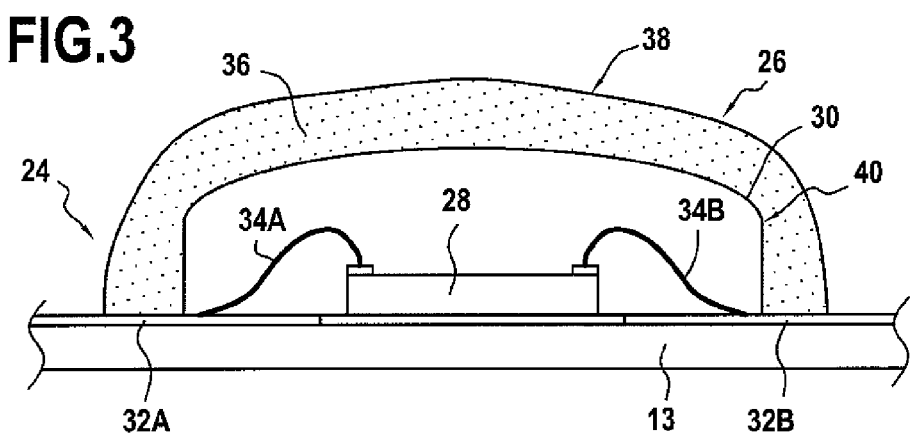
FIG. 3 is a detailed sectional view of the light emitting diode of FIGS. 1 and 2.

In a standard way and as this is illustrated in FIG. 3, this component 24 comprises a semiconducting junction 28 determining the emission wavelength of the diode 24, this junction being preferably encapsulated in a casing 30, currently designated by the term of "lid", and for example made in a material essentially comprising an epoxy resin.

Generally, the wavelengths of the light emitted by the diode 24 are notably determined by the nature of the semiconducting materials making up the semiconducting junction 28 and in this case, the lid 30 is preferably transparent.

In the described example, the first predefined color emitted by the diode 24 is substantially white.

In order to obtain this first predefined white color, the diode 24 comprises a semiconducting junction 28 emitting wavelengths in a primary spectral region and means 40 for converting wavelengths of this primary region to a secondary spectral region corresponding to the first predefined white color.

Thus, in this example, the conversion means 40 are formed by the lid 30 which is made in a material based on luminophores (generally YAG:Ce (yttrium-aluminium garnet doped with neodymium)) and which forms an energy absorption layer allowing conversion of the wavelengths of the primary spectral region to the secondary spectral region.

In this example, the primary spectral region extends from about 370 nm to 420 nm or 420 nm to 480 nm (ultraviolet to blue) and the secondary spectral region substantially extends over the whole of the visible spectrum (400 nm to 725 nm).

As this is illustrated in FIG. 3, the diode 24 comprises two electric contacts 32A, 32B for its connection of the diode 24 to external components. Both of these contacts 32A, 32B are connected by wire (electrically conducting wires 34A, 34B) to the junction 28.

Preferably, the diode 24 is of the SMC (Surface Mounted Component) type. Thus in a standard way, a surface mounted component may be added onto a substrate of a printed circuit by adhesive bonding, brazing or soldering unlike a component provided with through-pins, the assembling of which to the substrate requires the formation of holes in the substrate for letting through the pins. In the illustrated example, the diode 24 is assembled to the layer 13 of the non-laminated card body by soldering or brazing.

Further, preferably, the body 12 is laid out so as to let through the light capable of being emitted by the diode 24. Thus, the body 12 for example comprises a substantially transparent area, or even possibly a translucent area, extending at right angles to the diode 24. For example, the layer 13 bearing the antenna circuit and the diode is inserted between at least two transparent, or even translucent layers.

The configuration of the antenna circuit 18 and of the diode 24 is defined by configuration parameters selected from a length of the wire of the antenna 16 of the circuit 18, a gap between two turns of the antenna 16, a width of the wire of the antenna 16, a number of turns of the antenna 16, the capacitance of the semiconducting junction 28 of the diode 24.

The configuration parameters are thus adjusted so that the operating frequency of the whole comprising the antenna circuit 18 and the diode 24 allows near field communication with an external card reader. For example, the operating frequency is adjusted to 13.56 MHz as defined by the ISO 14 443 standard.

More particularly, by means of the invention, it is possible to modify the first predefined color of the diode 24 without modifying its junction 28 and therefore independently of the configuration of the antenna circuit 18 and of the diode 24.

More specifically, according to the invention, the lid 30 of the diode 24 is coated with a mass of material 36.

This material mass 36 forms means 38 for selecting a set of wavelengths from those making up the first color so that the light transmitted through the mass 36 has a second predefined color different from the first color.

The material of the mass 36 for example essentially comprises a coloring product, the color of which substantially corresponds to the desired second predefined color. Preferably the material of the mass 36 essentially comprises a resin which is polymerizable with an ultraviolet light and/or a thermosetting resin. The coloring product for example comprises a standard colored ink.

In the illustrated example, the display of the card 10 represents a match 42 with an incandescent end 44. The indicator light 24 formed by the diode extends in this end 44 so as to give an impression of lighting the match 42 when the communication is established.

The color of the indicator 24 is red in this case. The coloring product is thus of red color which allows selection of wavelengths substantially comprised between 625 nm and 725 nm in the visible spectrum, which substantially extends from 400 nm to 745 nm, emitted by the diode 24.

As an alternative, the display may include a sun and in this case the card 10 bears an indicator light with a substantially yellow color. In this case, the mass 36 deposited on the lid 30 of the diode 24 comprises a yellow colored product allowing selection of the wavelengths comprised between 565 nm and 590 nm from the wavelengths making up the white color emitted by the diode 24.

The main steps of a method for manufacturing a card according to the invention will now be described.

During a first step, the antenna wire 16 is positioned on one face of a first layer 13 of the non-laminated card body 12 for example by means of ultrasonic method and during a second step, a machine with a jointed arm of the "pick-and-place machine" type positions the light emitting diode 24 on a portion of the path of the wire of the antenna 16 and fixes it on the layer 13 by brazing, adhesive bonding or soldering.

Further, in order to allow electric connection of the antenna 16 and of the microcircuit 14, the ends 16A, 16B of the antenna wire 16 are soldered to the pads 22A, 22B.

Next, during a third step, a material is deposited as a mass 36 on the lid 30 of the diode 24 and it is then proceeded with polymerization or thermosetting of this mass 36.

Once the material mass 36 is hard, the first layer 13 is inserted between two compensation layers intended to substantially correct the surface irregularities of the first layer 13 bearing the diode 24. Preferably, the compensation layers are made in a transparent or optionally translucent material so that the indicator light 24 is sufficiently visible, even through the layers.

Once the layers are superposed, the latter are laminated. A cavity for receiving the microcircuit 14 is then machined so as to expose the contact pads 22A, 22B for their electric connection with the microcircuit 24.

By means of the invention, it is possible to select from a large range of different colors, the predefined color of the indicator light, without modifying the configuration of the electronic circuit comprising the electronic components, such as the antenna, the microcircuit and the diode.

This allows adaptation of the color of the indicator light to a specific graph of the card being produced without requiring a modification of the production chains and notably relative positionings and of the shape of the antenna circuit and of the diode.

Further, by means of the resin, formed by the material mass, it is possible to obtain greater strength of this component during the different steps for manufacturing the card, notably during lamination steps. The result of this is a lower rejection rate of faulty cards during their manufacturing.

It is well understood that the embodiments which have just been described do not have any limitation and they may receive any desirable modification without departing from the scope of the invention for this. In particular, it would be compliant with the invention to apply the characteristics of the claims to any type of cards and notably to contactless cards.

The invention claimed is:

1. A first and a second microcircuit card, each card comprising a displayed representation and at least one light-emitting diode provided with a lid, capable of emitting a first predefined color and a near field communications antenna, the antenna and the diode being configured so that the diode emits light when a microcircuit of the card communicates with a card reader at a near field communication frequency through the antenna, wherein the lid of the diode is coated with a mass of material selecting a set of wavelengths from those making up the first color so that the light transmitted by the mass has a second predefined color different from the first color, the at least one light-emitting diode being the same for the first and second cards, the antenna being the same for the first and second of cards, and the material being chosen for each card so that the second predefined color matches a color of the displayed representation of each card, wherein a color of the displayed representation of the first card is different from the color of the displayed representation of the second card, the antenna being formed by an electrically-conducting wire, the light-emitting diode being positioned on, and connected to, a portion of a path of the wire of the antenna, so that the light-emitting diode emits light at a pre-defined near-field current.

2. The card according to claim 1, wherein the first predefined color is substantially white.

3. The card according to claim 1, wherein the diode comprises a semiconducting junction for emitting wavelengths in a primary spectral region and means for converting the wavelengths of the primary region to a secondary spectral region corresponding to the first predefined color.

4. The card according to claim 3, wherein the primary spectral region extends from about 370 nm to 420 nm or 420 nm to 480 nm and the second spectral region substantially extends in the whole of the visible spectrum.

5. The card according to claim 4, wherein the material of the mass essentially comprises a colored product of a color substantially corresponding to the second predefined color.

6. The card according to claim 3, wherein the material of the mass essentially comprises a resin which is polymerizable with ultraviolet light and/or a thermosetting resin.

7. The card according to claim 1, wherein the configuration of the antenna circuit and of the diode is defined by configuration parameters selected from a length of a wire of an antenna of the circuit, a gap between two turns of the antenna, a width of the wire of the antenna, a number of turns of the antenna, a capacitance of a semiconducting junction of the diode.

8. The card according to claim 1, wherein the antenna circuit comprises a microcircuit and an antenna connected to the microcircuit.

9. The card according to claim 1, wherein the diode is of the SMC (surface mounted component) type.

10. The card according to claim 1, comprising a card body incorporating the antenna circuit and the diode, laid out so as to let through the light capable of being emitted by the diode.

11. A method for manufacturing a card according to claim 1, the card comprising a body obtained by lamination of a plurality of layers, at least one of which bears the antenna circuit and the diode, wherein before lamination of the layers together, a material is deposited as a mass on the lid of the diode.

12. The card according to claim 1, wherein the displayed representation comprises a representation of a sun, a representation of an alarm indicator light, or a representation of a match with an incandescent light.

13. A method of manufacturing microcircuit cards, each card comprising a displayed representation and at least one light-emitting diode provided with a lid, capable of emitting a first predefined color and a near field communications antenna, the method comprising using, for each card a same antenna, formed by an electrically-conducting wire, and a same diode, said antenna and diode of each card being configured so that the diode emits light when a microcircuit of the card communicates with a card reader at a predefined near field communication frequency through the antenna, and the method further coating the lid of the diode with a mass of material selecting a set of wavelengths from those making up the first color so that the light transmitted by the mass has a second predefined color different from the first color, the material being chosen for each card so that the second color matches a color of the displayed representation of each card, the method further comprising positioning the light-emitting diode on, and connecting the light-emitting diode to, a portion of a path of the wire of the antenna, so that the light-emitting diode emits light at a pre-defined near-field current.

14. The method according to claim 13, wherein the displayed representation comprises a representation of a sun, a representation of an alarm indicator light, or a representation of a match with an incandescent light.

* * * * *